United States Patent
Itoh et al.

(10) Patent No.: US 10,620,468 B2
(45) Date of Patent: Apr. 14, 2020

(54) METHOD OF MANUFACTURING DISPLAY PANEL SUBSTRATE

(71) Applicant: Sharp Kabushiki Kaisha, Sakai, Osaka (JP)

(72) Inventors: Toshikatsu Itoh, Sakai (JP); Tohru Daitoh, Sakai (JP); Hajime Imai, Sakai (JP); Masaki Maeda, Sakai (JP); Hideki Kitagawa, Sakai (JP); Yoshihito Hara, Sakai (JP); Tatsuya Kawasaki, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/161,114

(22) Filed: Oct. 16, 2018

(65) Prior Publication Data

US 2019/0113789 A1    Apr. 18, 2019

(30) Foreign Application Priority Data

Oct. 18, 2017    (JP) ................................. 2017-201799

(51) Int. Cl.
*H01L 27/12* (2006.01)
*G02F 1/1333* (2006.01)
(Continued)

(52) U.S. Cl.
CPC ...... *G02F 1/13338* (2013.01); *G02F 1/13439* (2013.01); *G02F 1/134309* (2013.01); *G02F 1/136227* (2013.01); *H01L 21/32133* (2013.01); *H01L 27/1262* (2013.01); *G02F 1/1368* (2013.01); *G02F 1/136286* (2013.01); *G02F 2001/133357* (2013.01); *G02F 2001/134372* (2013.01); *G02F 2001/136295* (2013.01); *H01L 27/124* (2013.01); *H01L 29/4908* (2013.01)

(58) Field of Classification Search
CPC ............... H01L 27/124; H01L 27/1225; H01L 29/7869; H01L 21/28; H01L 21/768
See application file for complete search history.

(56) References Cited

U.S. PATENT DOCUMENTS

| 7,821,613 | B2 | 10/2010 | Kimura |
| 8,149,346 | B2 | 4/2012 | Kimura |

(Continued)

FOREIGN PATENT DOCUMENTS

| JP | 2007-133371 A | 5/2007 |
| JP | 2007-199708 A | 8/2007 |

(Continued)

*Primary Examiner* — Jaehwan Oh
(74) *Attorney, Agent, or Firm* — Keating & Bennett, LLP

(57) ABSTRACT

A method of manufacturing a display panel substrate includes a transparent conductive film formation step of forming a transparent conductive film on a flattening film that covers a switching component disposed on a substrate, a metallic film formation step of forming a metallic film so as to cover the transparent conductive film after the transparent conductive film formation step, a line formation step of forming a line by etching the metallic film after the metallic film formation step, and a transparent electrode formation step of forming a transparent electrode that is connected to the line by etching the transparent conductive film after the wire formation step.

4 Claims, 10 Drawing Sheets

(51) Int. Cl.
  H01L 21/3213 (2006.01)
  G02F 1/1343 (2006.01)
  G02F 1/1362 (2006.01)
  H01L 29/49 (2006.01)
  G02F 1/1368 (2006.01)

(56) References Cited

U.S. PATENT DOCUMENTS

| | | |
|---|---|---|
| 8,576,347 B2 | 11/2013 | Kimura |
| 8,634,044 B2 | 1/2014 | Kimura |
| 8,885,114 B2 | 11/2014 | Kimura |
| 9,207,504 B2 | 12/2015 | Kimura |
| 9,213,206 B2 | 12/2015 | Kimura |
| 9,690,155 B2 | 6/2017 | Takamaru et al. |
| 9,703,140 B2 | 7/2017 | Kimura |
| 9,835,915 B2 | 12/2017 | Kim et al. |
| 9,958,736 B2 | 5/2018 | Kimura |
| 2007/0139571 A1 | 6/2007 | Kimura |
| 2007/0146592 A1 | 6/2007 | Kimura |
| 2007/0236640 A1 | 10/2007 | Kimura |
| 2010/0177269 A1 | 7/2010 | Kimura |
| 2011/0032435 A1 | 2/2011 | Kimura |
| 2012/0170784 A1 | 7/2012 | Kimura |
| 2013/0077008 A1 | 3/2013 | Kim et al. |
| 2014/0118675 A1 | 5/2014 | Kimura |
| 2014/0132872 A1 | 5/2014 | Kimura |
| 2015/0221680 A1* | 8/2015 | Nakata ............. G02F 1/136204 349/40 |
| 2015/0228675 A1* | 8/2015 | Takanishi .......... G02F 1/133345 257/43 |
| 2015/0241744 A1* | 8/2015 | Nakata ................ H01L 27/0296 349/42 |
| 2015/0277168 A1* | 10/2015 | Takanishi ............ H01L 29/7869 349/43 |
| 2016/0033820 A1 | 2/2016 | Kimura |
| 2016/0154283 A1 | 6/2016 | Kimura |
| 2016/0187690 A1 | 6/2016 | Nam et al. |
| 2016/0291366 A1* | 10/2016 | Hara .................... G02F 1/1345 |
| 2017/0038651 A1 | 2/2017 | Takamaru et al. |
| 2018/0024402 A1 | 1/2018 | Kimura |
| 2018/0059495 A1 | 3/2018 | Kim et al. |
| 2019/0004380 A1 | 1/2019 | Kimura |

FOREIGN PATENT DOCUMENTS

| | | |
|---|---|---|
| JP | 2007-298976 A | 11/2007 |
| JP | 2009-116058 A | 5/2009 |
| JP | 2013-068949 A | 4/2013 |
| JP | 2016-111034 A | 6/2016 |
| JP | 2016-126336 A | 7/2016 |
| WO | 2015/159800 A1 | 10/2015 |

* cited by examiner

METHOD OF MANUFACTURING DISPLAY PANEL SUBSTRATE

CROSS REFERENCE TO RELATED APPLICATION

This application claims priority from Japanese Patent Application No. 2017-201799 filed on Oct. 18, 2017. The entire contents of the priority application are incorporated herein by reference.

TECHNICAL FIELD

The technology described herein relates to a method of manufacturing a display panel substrate.

BACKGROUND

There has been known a display panel having a touch panel function. Such a display panel is described in Japanese Unexamined Patent Application Publication No. 2016-126336. Such a display panel includes a common electrode formed of a transparent conductive film and a conductive line (wire) that are electrically connected to each other to supply a touch drive signal from a driver to the common electrode via the conductive line. This allows the common electrode to act as a touch electrode.

SUMMARY

To manufacture a display panel substrate configured as described above, it is necessary to form a plurality of films on a substrate such as a glass substrate, which may increase the number of manufacturing steps. Accordingly, there is a demand for decreasing the number of steps.

The technology described herein was made in view of the above circumstances. An object is to provide a method of manufacturing a display panel substrate with a decreased number of steps.

To solve the foregoing issue, a method of manufacturing a display panel substrate according to the technology described herein includes a transparent conductive film formation step of forming a transparent conductive film on a flattening film that covers a switching component disposed on a substrate, a metallic film formation step of forming a metallic film so as to cover the transparent conductive film after the transparent conductive film formation step, a line formation step of forming a line by etching the metallic film after the metallic film formation step, and a transparent electrode formation step of forming a transparent electrode that is connected to the line by etching the transparent conductive film after the wire formation step.

According to the foregoing method, the transparent electrode formed of the transparent conductive film is interposed between the line (metallic film) and the flattening film to improve adhesion of the line as compared to the configuration including the line that is directly formed on the flattening film. If the flattening film, the transparent conductive film, the line, and the transparent electrode are stacked in this order, the method necessarily includes both of the step of forming the transparent conductive film between the line and the flattening film and the step of forming the transparent electrode film for making the transparent electrode. As compared to this, according to the foregoing method, the flattening film, the transparent electrode, and the line are stacked in this order, which decreases the number of the steps for forming the transparent electrode film.

If the flattening film, the line, and the transparent electrode are stacked in this order, the transparent electrode is arranged over the line, which causes a height difference at the formation position of the line due to the thickness of the line. As a result, the transparent electrode may be partially disconnected at the height-difference portions. According to the foregoing method, by stacking the flattening film, the transparent electrode, and the line in this order, a height difference is less likely to be formed on the transparent electrode and the partial disconnection of the transparent electrode is less likely to be caused.

According to the technology described herein, an object is to provide a method of manufacturing a display panel substrate with a decreased number of steps.

DETAILED DESCRIPTION

First Embodiment

Figure 1:
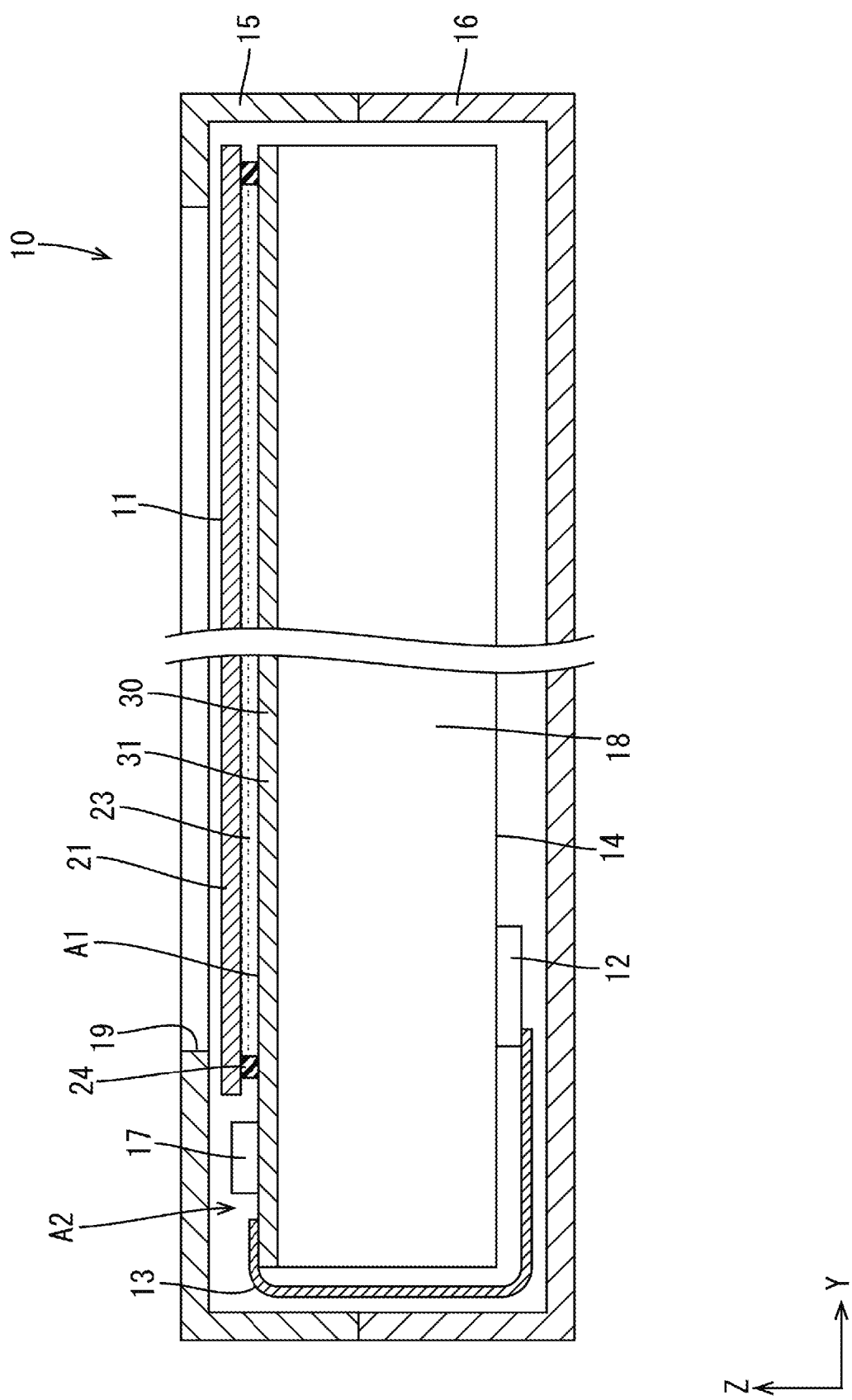
FIG. 1 is a cross-sectional view of a liquid crystal display device according to a first embodiment of the present technology taken along a longitudinal direction (Y-axis direction).

A first embodiment of the technology described herein will be described with reference to FIGS. 1 to 9. A liquid crystal display device 10 includes, as illustrated in FIG. 1, a liquid crystal panel 11 (display panel), a control circuit board 12 (external signal supply source) that supplies various input signals to a driver 17 included in the liquid crystal panel 11, a flexible board 13 (external connection part) that electrically connects the liquid crystal panel 11 and the external control circuit board 12, and a backlight unit (lighting unit) as an external light source supplying light to the liquid crystal panel 11. The backlight unit 14 includes, as illustrated in FIG. 1, a chassis 18 that has a substantially box shape opened to the front side (the liquid crystal panel 11 side), a light source (for example, cold-cathode tube, LED, organic EL, or the like) (not illustrated) that is disposed in the chassis 18, and an optical member (not illustrated) that covers an opening of the chassis 18. The optical member has the function of converting light emitted from the light source into a planar form. The liquid crystal panel 11 has a display area A1 configured to display images and a non-display area A2 that surrounds the display area A1.

The liquid crystal display device 10 also includes, as illustrated in FIG. 1, a pair of front and back exterior members 15 and 16 that stores the liquid crystal panel 11 and the backlight unit 14. The front exterior member 15 has an opening 19 such that the image displayed in the display area A1 of the liquid crystal panel 11 can be seen from the outside. The liquid crystal display device 10 according to the present embodiment is used for various kinds of electronic equipment (not illustrated) such as mobile phones (including smartphones and others), notebook computers (including tablet-type notebook computers and others), wearable terminals (including smartwatches and others), mobile information terminals (including e-books, PDAs, and others), mobile game machines, and digital photo frames.

The liquid crystal panel 11 includes, as illustrated in FIG. 1, a pair of substrates 21 and 30 opposed to each other, a liquid crystal layer 23 (medium layer) that is disposed between the pair of substrates 21 and 30 and includes liquid crystal molecules as a substance with optical characteristics varying according to application of an electric field, and a seal member 24 that is disposed between the pair of substrates 21 and 30 and surrounds the liquid crystal layer to seal the liquid crystal layer 23. Of the pair of substrates 21 and 30, the front (front surface side, the upper side of FIG. 1) substrate is a CF substrate 21 (opposing substrate), and the back (rear surface side) substrate is an array substrate 30 (active matrix substrate, element-side substrate). The liquid crystal molecules included in the liquid crystal layer 23 are horizontally oriented, but they are not limited to this. A polarization plate (not illustrated) is bonded to the outer surfaces of the substrates 21 and 30. The CF substrate 21 is formed by stacking a color filter, an overcoat film, and an alignment film (none of which is illustrated) on the inner side (the liquid crystal layer 23 side) of a glass substrate (not illustrated). The color filter includes color portions (not illustrated) of three colors, R (red), G (green), and B (blue) that are arrayed in a matrix. The color portions are opposed to the pixels of the array substrate 30.

Figure 2:
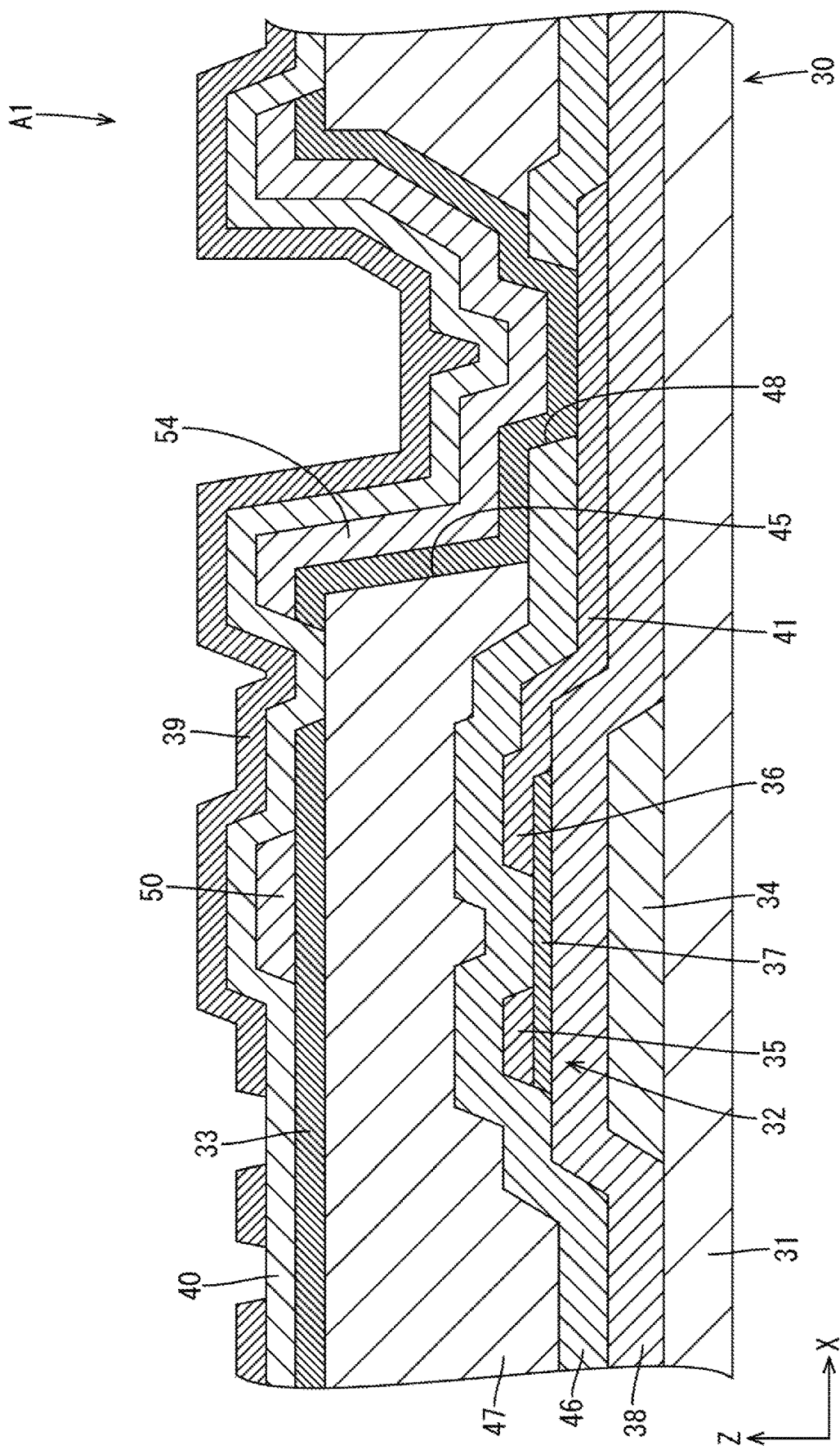
FIG. 2 is a cross-sectional view of an array substrate.
Figure 3:
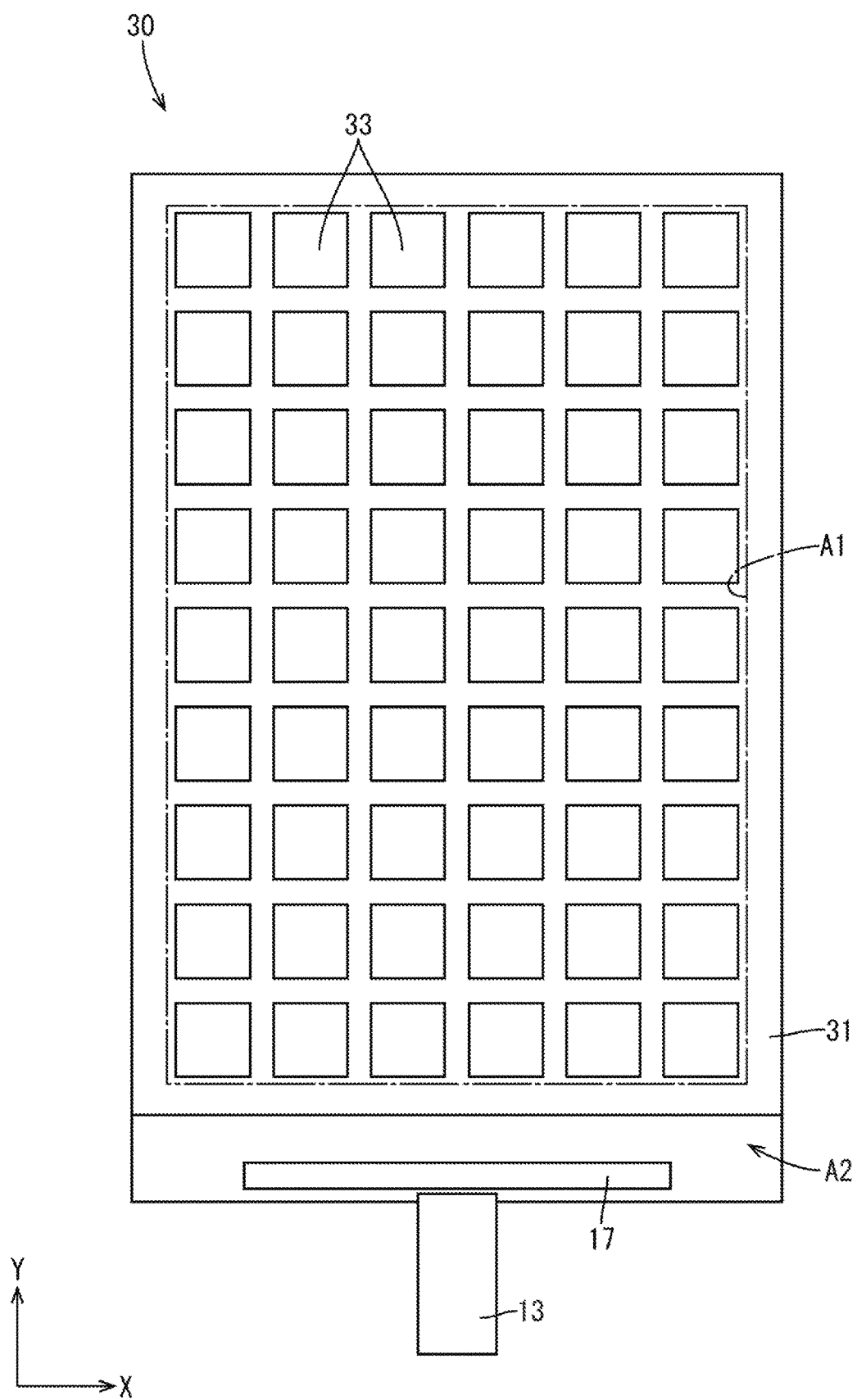
FIG. 3 is a planar view of the array substrate.

The array substrate 30 is formed such that various films are formed in layers by photolithography on the inner surface side of the glass substrate 31 (substrate) as illustrated in FIG. 2. The driver 17 (panel drive unit) is disposed on one side section of the glass substrate 31 (part of the non-display area A2) to drive the liquid crystal panel 11 (see FIG. 1). On the inner surface side of the glass substrate 31 (the liquid crystal layer 23 side, the upper side in FIG. 2), thin film transistors (TFTs: display components) 32 as switching components and pixel electrodes 33 are arranged in the display area A1. The plurality of pixel electrodes 33 is arrayed in a matrix (rows and columns) in the display area A1 as illustrated in FIG. 3. The number of the pixel electrode 33 illustrated in FIG. 3 is smaller than the actual number.

The TFTs 32 are disposed below the pixel electrodes and are arranged in a matrix (rows and columns) in the display area A1. The TFTs 32 are connected to the pixel electrodes 33, respectively. Each of the TFTs 32 has a gate electrode 34, a source electrode 35, a drain electrode 36, and a channel portion 37. The channel portion 37 overlaps the gate electrode 34. A gate insulation film 38 is interposed between the channel portion 37 and the gate electrode 34. The channel portion 37 connects the source electrode 35 and the drain electrode 36. An insulation film 46 and a flattening film 47 are stacked on the channel portion 37, the source electrode 35, and the drain electrode 36. The pixel electrodes 33 are formed on the flattening film 47. The drain electrode 36 is connected to a drain line 41. The drain line 41 is electrically connected to the pixel electrodes 33 (transparent electrodes) through a contact hole 45 formed in the flattening film 47 and a contact hole 48 formed in the insulation film 46. The flattening film 47 (organic insulation film) is formed of an organic material such as an acrylic resin (e.g. PMMA), for example, and is thicker than other insulation films 38, 46, and 40.

The gate electrode 34, the source electrode 35, and the drain electrode 36 are formed of laminated films of titanium (Ti) and copper (Cu), for example, but they are not limited to this. The gate line and source line (not illustrated) are arranged in a grid pattern around the TFTs 32 and the pixel electrodes 33. The gate electrode 34 is connected to the gate line, and the source electrode 35 is connected to the source line. The TFTs 32 are driven according to various signals supplied from the driver 17 to the gate line and the source line. According to the driving of the TFTs 32, the supply of potentials to the pixel electrodes 33 is controlled.

As illustrated in FIG. 2, the array substrate 30 has a common electrode 39 on the front side of the pixel electrodes 33. The insulation film 40 is between the pixel electrodes 33 and the common electrode 39. The gate insulation film 38 and the insulation films 40 and 46 are formed of laminated films of silicon dioxide ($SiO_2$) and silicon nitride ($SiN_x$), for example, but they are not limited to this. The pixel electrodes 33 and the common electrode 39 are formed of transparent electrode films of indium tin oxide (ITO) or indium zinc oxide (IZO), for example, but they are not limited to this. The common electrode 39 has a plurality of slits (not illustrated), for example. If a potential difference is generated between the pixel electrodes 33 and the common electrode 39 that are overlapped with each other according to the charging of the pixel electrodes 33, a fringe electric field (oblique electric field) including a component along the plate surface of the array substrate 30 and a component along the direction of normal to the plate surface of the array substrate 30 is generated between the opening edges of slits of the common electrode 39 and the pixel electrodes 33. The fringe electric field is used to control the alignment state of liquid crystal molecules included in the liquid crystal layer 23. That is, the operating mode of the liquid crystal panel 11 according to the present embodiment is a fringe field switching (FFS) mode.

The liquid crystal display device 10 in the present embodiment is an in-cell liquid crystal display device that has both the display function of displaying images and the touch panel function (position input function) of detecting the position of an input made by the user (input position) based on the displayed images. The touch panel detection type in the present embodiment is a projection electrostatic capacitance type, for example, a self-capacitance type. In the present embodiment, the pixel electrodes 33 are used as electrodes for position detection. If a user of the liquid crystal display device 10 puts a finger, which is a conductor (a position input body not illustrated), close to the surface (display surface) of the liquid crystal panel 11, electrostatic capacitance is formed between the finger and the pixel electrodes 33. Accordingly, the electrostatic capacitance detected at the pixel electrodes 33 near the finger is different from the electrostatic capacitance detected at the pixel electrodes 33 distant from the finger. Thus, the position of the input made by the finger can be detected based on the difference. The pixel electrodes 33 are connected to a line 50 (position detection line). The line 50 is formed of a metallic film of copper (Cu), for example, but is not limited to this. The line 50 may be formed by stacking different kinds of conductive films.

The line 50 extends from the pixel electrodes 33 to the driver 17 and is electrically connected to the driver 17. The line 50 extends along the source line, for example, but the route of the line 50 is not limited to this. At the time of control for detecting the input position in the display area A1, the control circuit board 12 supplies a drive signal for detecting the input position to the pixel electrodes 33 via the driver 17 and the line 50 and receives a detection signal via the driver 17 and the line 50. Accordingly, the pixel electrodes 33 act as position detection electrodes.

Next, a method of manufacturing the liquid crystal panel 11 will be described. The liquid crystal panel 11 is manufactured by producing each of the CF substrate 21 and the array substrate 30 and then bonding the CF substrate 21 and the array substrate 30 to each other. The method of manufacturing the array substrate 30 (display panel substrate) at least includes a gate conductive film formation step of forming the gate electrode 34 and the gate line, a gate insulation film formation step of forming the gate insulation film 38, a channel portion formation step of forming the channel portion 37, a source drain formation step of forming the source electrode 35, the source line, the drain electrode 36, and the drain line 41, a first insulation film formation step of forming the insulation film 46, a flattening film formation step of forming the flattening film 47, steps of forming the pixel electrodes 33 and the line 50 (described later in detail), a second insulation film formation step of forming the insulation film 40, and a common electrode formation step of forming the common electrode 39.

In each of the foregoing steps, a thin film pattern is formed by photolithography. Specifically, each of the foregoing steps includes a film formation step of forming a thin film as a base for the thin film pattern, a resist formation step of forming a resist pattern in a shape corresponding to the thin film pattern by performing an exposure treatment and a development treatment to a resist, and an etching step of forming the thin film pattern by performing etching with the resist pattern as a mask. In the film formation step, plasma CVD, sputtering, vacuum evaporation, or the like is used as appropriate according to the kind of the thin film. In the etching step, wet etching or dry etching is used as appropriate according to the kind of the thin film to be etched. In the following description, among the foregoing steps, the respective steps of forming the pixel electrodes 33 and the line 50 will be described.

Figure 4:
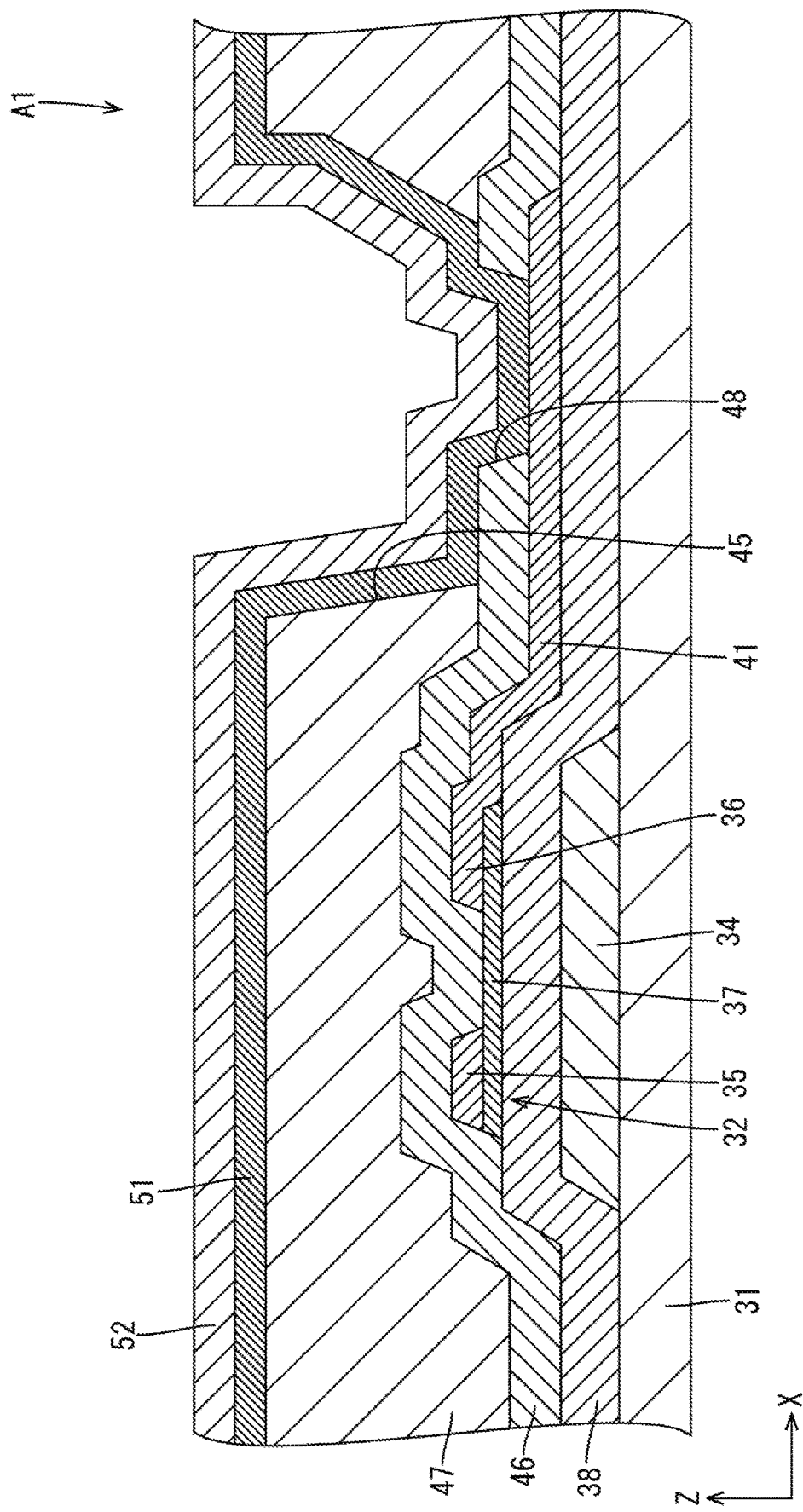
FIG. 4 is a cross-sectional view of a substrate in a metallic film formation step.

The pixel electrodes 33 and the line 50 are formed by performing a transparent conductive film formation step, a metallic film formation step, a line formation step, and a transparent electrode formation step. In the transparent conductive film formation step, as illustrated in FIG. 4, a transparent conductive film 51 as a base for the pixel electrodes 33 is formed on the flattening film 47 that covers the TFTs 32. At this point in time, the transparent conductive film 51 is connected to the drain line 41 via the contact hole 45 formed in the flattening film 47 and the contact hole 48 formed in the insulation film 46. In the metallic film formation step after the transparent conductive film formation step, as illustrated in FIG. 4, a metallic film 52 as a base for the line 50 is formed in such a manner as to cover the transparent conductive film 51.

(Line Formation Step)

Figure 5:
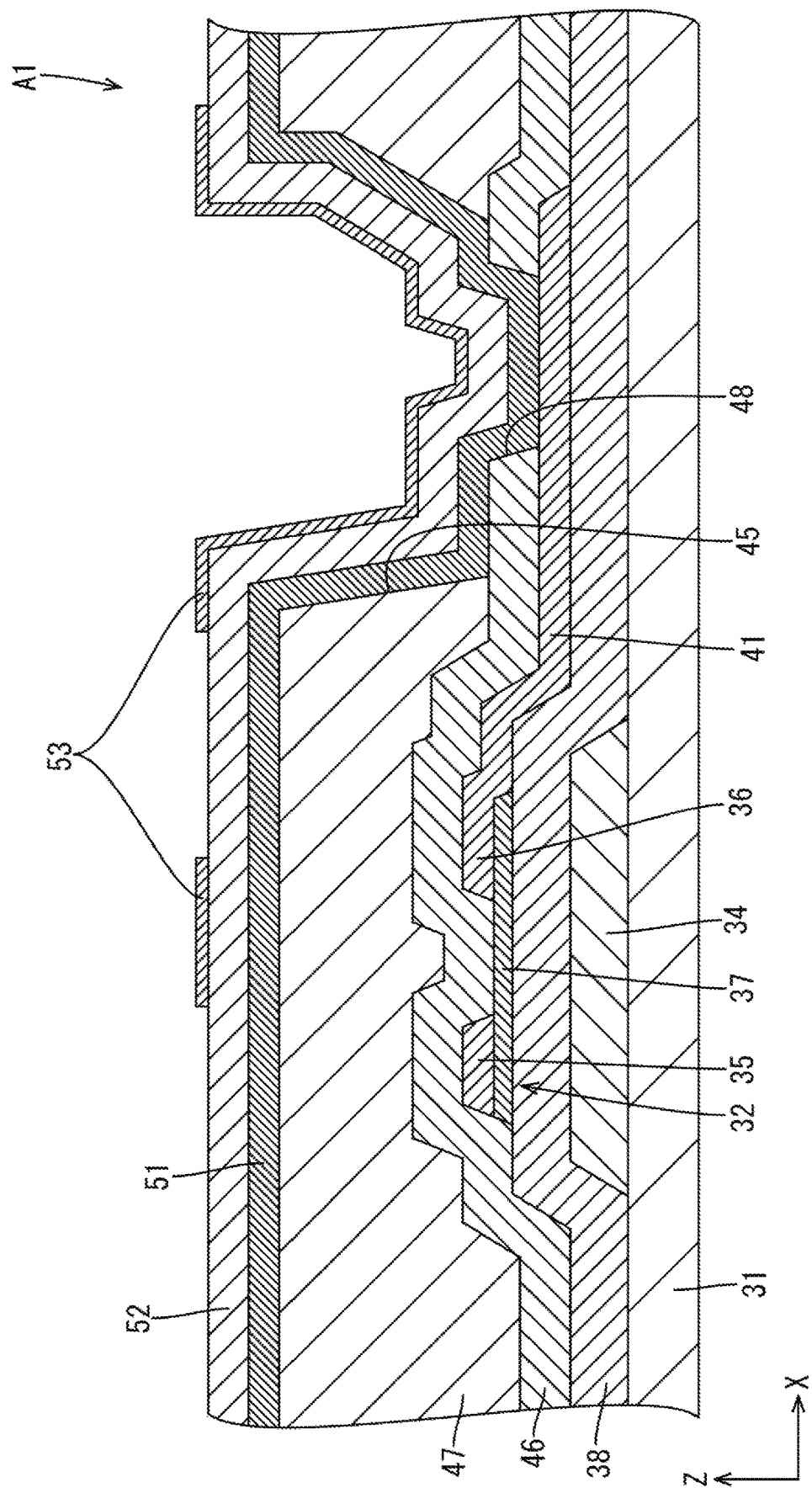
FIG. 5 is a cross-sectional view of the substrate having a resist on the metallic film.
Figure 6:
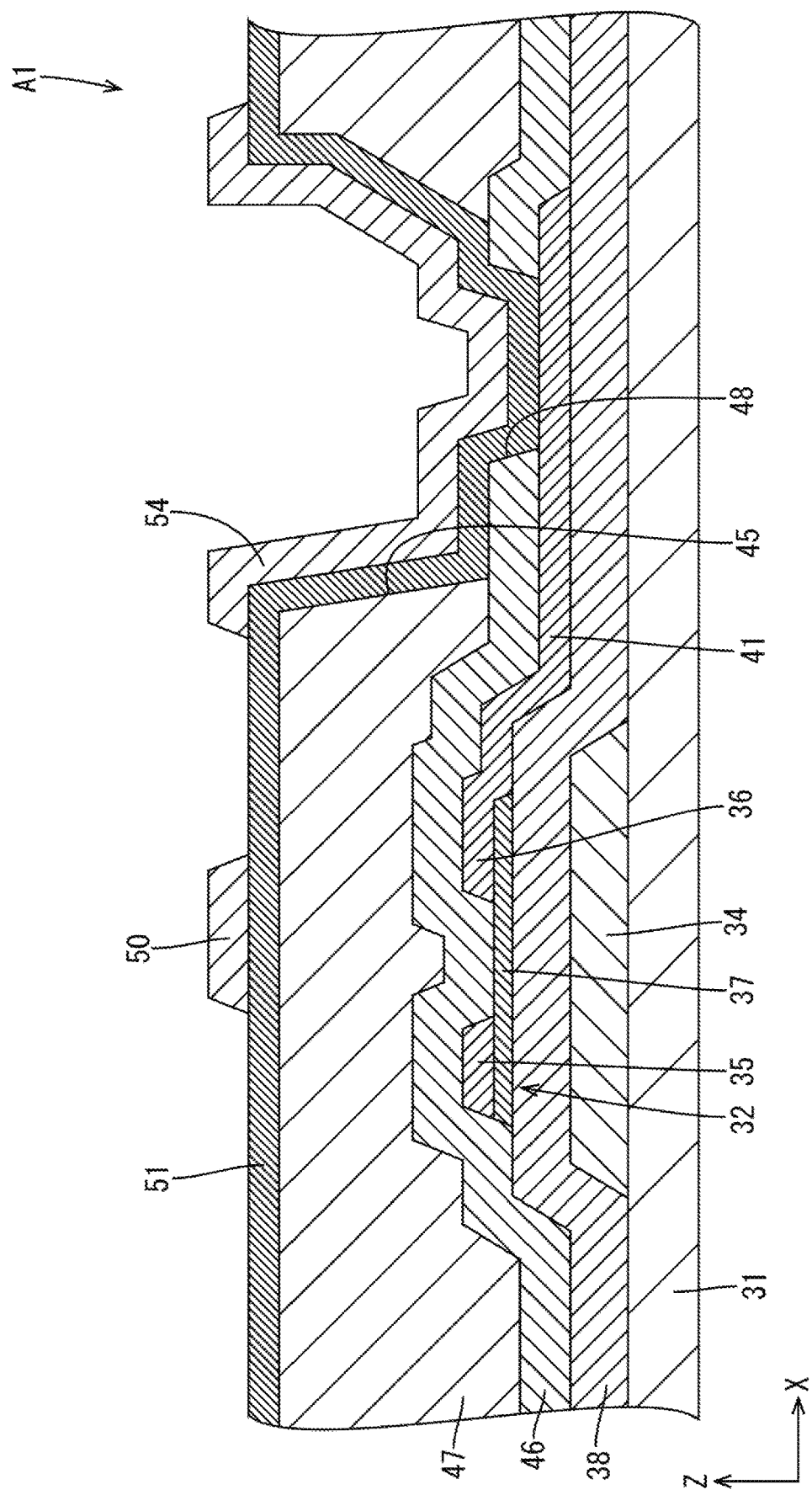
FIG. 6 is a cross-sectional view of the substrate having a line formed by etching.

In the line formation step after the metallic film formation step, as illustrated in FIG. 5, a resist (photoresist) is applied to the top of the metallic film 52, the resist is light-exposed via a predetermined photomask, and then the light-exposed resist is developed to form a patterned resist 53 (resist pattern for line formation). Next, the metallic film 52 is etched with the resist 53 as a mask. The resist 53 is disposed such that a part thereof covers the portion of the metallic film 52 covering the contact hole 45. Accordingly, the portion of the metallic film 52 covered with the resist 53 remains without being etched, but a portion of the metallic film 52 not covered with the resist 53 is removed. Consequently, as illustrated in FIG. 6, the line 50 is formed on the transparent conductive film 51. In addition, part of the metallic film 52 constitutes a cover portion 54 that covers the transparent conductive film 51 at the position of the contact hole 45.

(Transparent Electrode Formation Step)

Figure 7:
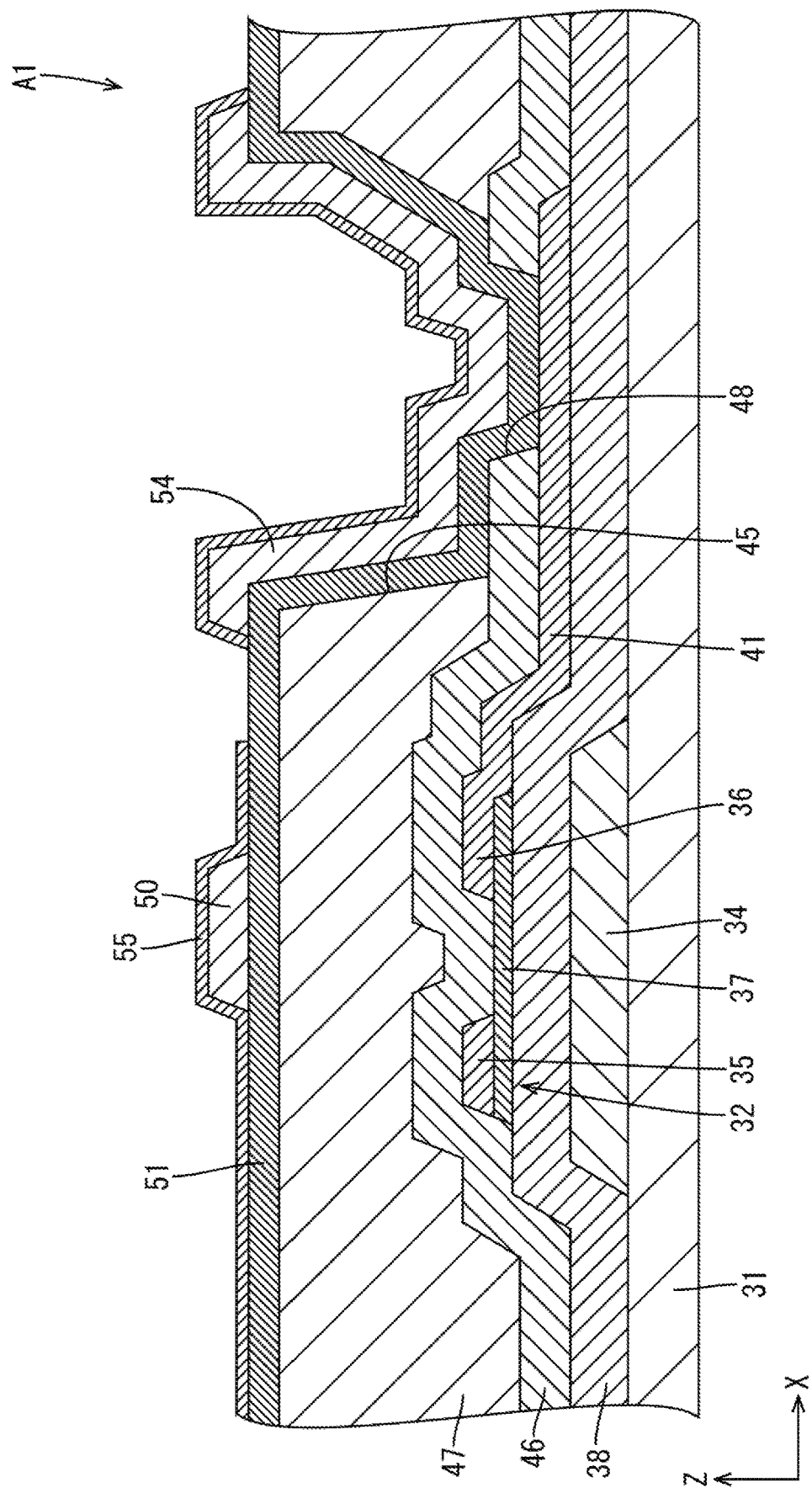
FIG. 7 is a cross-sectional view of the substrate having a resist formed on the line.

In the transparent electrode formation step performed after the line formation step, as illustrated in FIG. 7, a resist (photoresist) is disposed on the top of the transparent conductive film 51, the line 50, and the cover portion 54 with coating, the resist is light-exposed via a predetermined photomask, and then the light-exposed resist is developed to form a patterned resist 55 (resist pattern for pixel electrode formation). Next, the transparent conductive film 51 is etched with the resist 55 as a mask. Accordingly, a portion of the transparent conductive film 51 covered with the resist 55 remains without being etched, but a portion of the transparent conductive film 51 not covered with the resist 55 is removed. Accordingly, as illustrated in FIG. 2, the pixel electrodes 33 (transparent electrodes) that are connected to the line 50 are formed on the flattening film 47. In the second insulation film formation step (insulation film formation step) performed after the transparent electrode formation step, the insulation film 40 is formed in such a manner as to cover the pixel electrodes 33 and the line 50. In the common electrode formation step performed after the second insulation film formation step, the common electrode 39 is formed on the insulation film 40.

Next, the advantageous effects of the present embodiment will be described. If the flattening film 47, the line 50, and the pixel electrodes 33 (an example of transparent electrodes) are stacked in this order, the pixel electrodes 33 are arranged over the line 50, which causes a height difference at the formation position of the line 50 due to the thickness of the line 50. As a result, the pixel electrodes 33 may be partially disconnected at the height-difference portion. According to the foregoing method, by stacking the flattening film 47, the pixel electrodes 33, and the line 50 in this order, a height difference is less likely to be formed on the pixel electrodes 33 and the partial disconnection of the pixel electrodes 33 is less likely to be caused.

According to the foregoing method, the pixel electrodes 33 formed of the transparent conductive film are interposed between the line 50 (metallic film 52) and the flattening film 47 to improve adhesion of the line 50 as compared to a configuration including the line 50 that is directly formed on the flattening film 47. If the flattening film 47, the transparent conductive film, the line 50, and the pixel electrodes 33 are stacked in this order, the method necessarily includes both of the step of forming the transparent conductive film between the line 50 and the flattening film 47 and the step of forming the transparent electrode film for making the pixel electrodes 33. As compared to this, according to the foregoing method, the flattening film 47, the pixel electrodes 33, and the line 50 are stacked in this order, which decreases the number of the steps for forming the transparent electrode film. In the present embodiment, the line 50 and the pixel electrodes 33 are in direct contact with each other, which eliminates the need to form a contact hole for electrical connection between the line 50 and the pixel electrodes 33.

Figure 8:
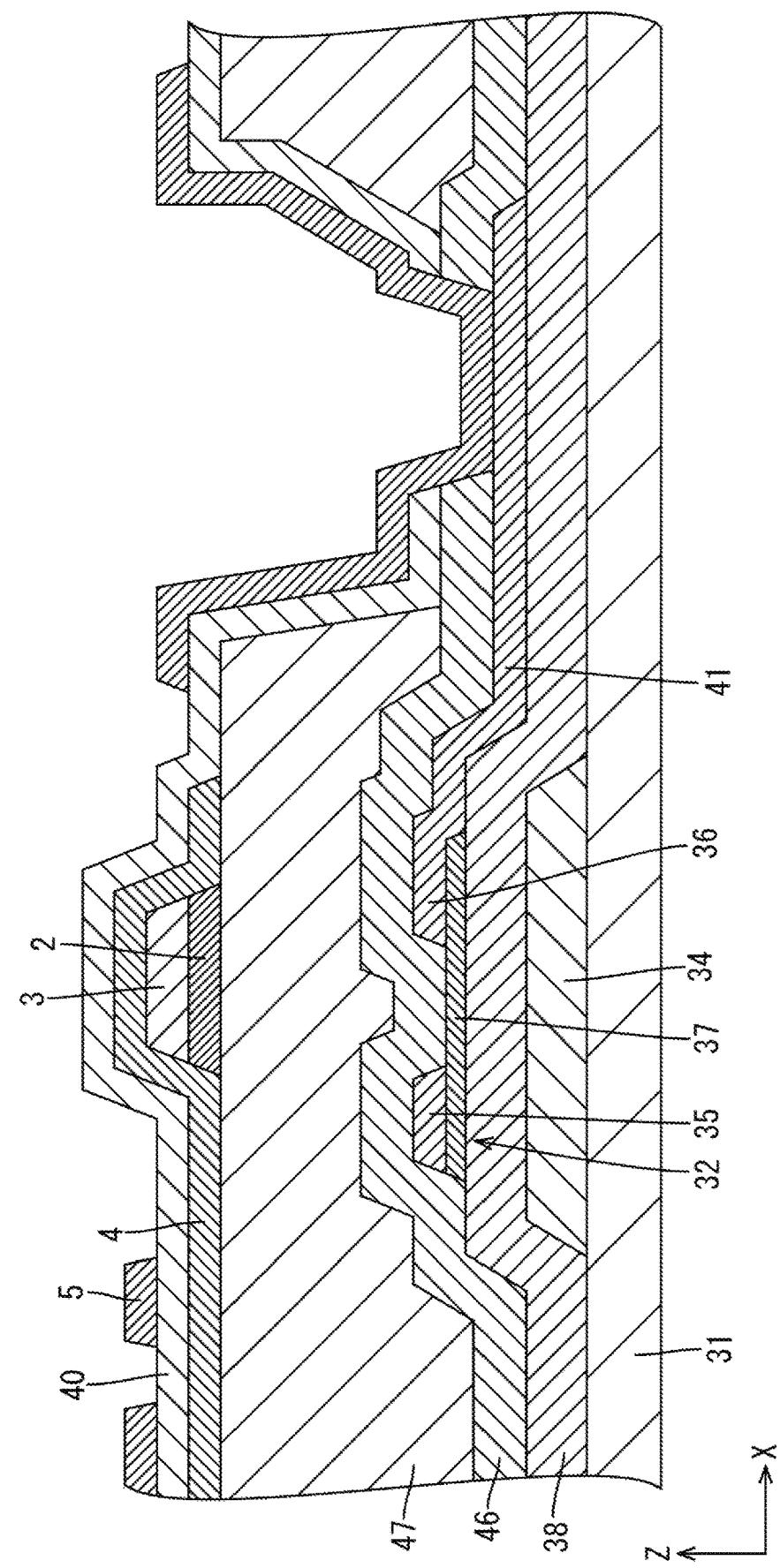
FIG. 8 is a cross-sectional view of a substrate according to a comparative example.

FIG. 8 illustrates a comparative example. FIG. 8 illustrates a structure in which a transparent electrode film 2, a line 3, a common electrode 4, an insulation film 40, and a pixel electrode 5 are stacked in this order on the flattening film 47. This configuration requires a step of forming the transparent electrode film 2 between the line 3 and the flattening film 47 and a step of forming a transparent electrode (the common electrode 4 in FIG. 8) on the line 3. In the present embodiment, the flattening film 47, the transparent electrodes (the pixel electrodes 33 in the present embodiment), and the line 50 are stacked in this order, which decreases the steps of forming the transparent electrode film as compared to the comparative example illustrated in FIG. 8.

Figure 9:
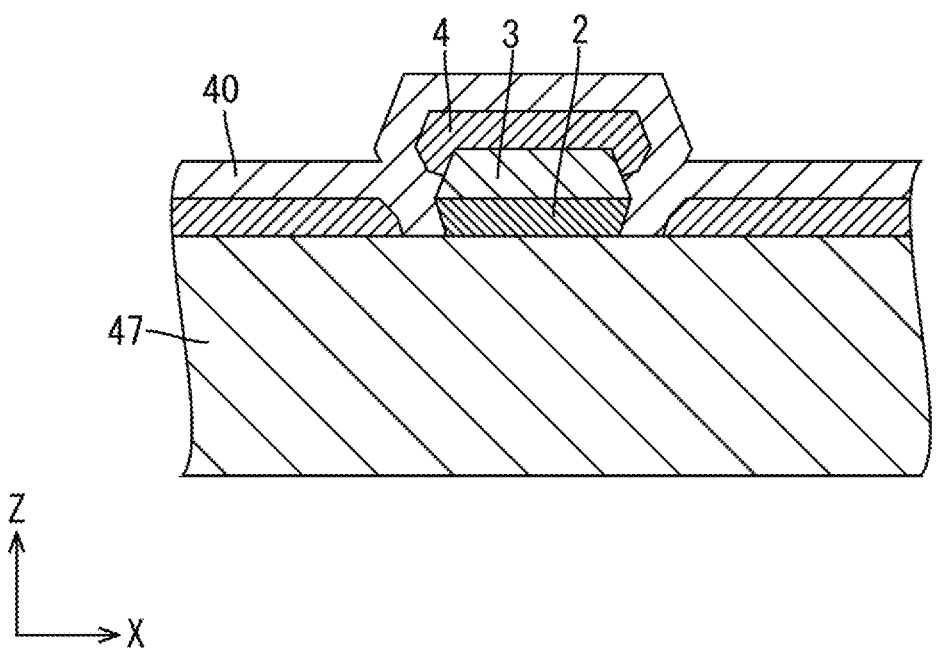
FIG. 9 is a cross-sectional view of the substrate according to the comparative example in which a common electrode is disconnected.

In the stacked structure of the comparative example illustrated in FIG. 8, the transparent electrode film 2 and the line 3 on the flattening film 47 are formed in substantially the same shape. At the formation of the transparent electrode film 2 and the line 3 by etching, the transparent electrode film 2 may be formed in a reverse-tapered shape as illustrated in FIG. 9. If the transparent electrode film 2 is formed in a reverse-tapered shape, the transparent electrode (the common electrode 4 in FIG. 9) on the line 3 might be partially disconnected as illustrated in FIG. 9. In the present embodiment, the transparent electrodes (the pixel electrodes 33) and the line 50 are stacked in this order, which suppresses the disconnection of the transparent electrodes. The transparent electrode film 2 may be formed in such a reverse-tapered shape because the etching rate of the transparent electrode film 2 is higher than the etching rate of the wire 3.

In the present embodiment, the pixel electrodes 33 are taken as an example of the transparent electrodes connected to the line 50. Accordingly, signals different from the signals input from the drain electrode 36 are input to the pixel electrodes 33 through the line 50 connected to the pixel electrodes 33. The pixel electrodes 33 can perform functions (for example, the touch sensor function) other than the image display function.

In the line formation step, the metallic film 52 is etched while the portion of the metallic film 52 that covers the contact hole 45 being covered with the resist 53. The portions of the pixel electrodes 33 connected to the drain electrode 36 can be covered with the cover portion 54 (part of the metallic film 52), which reduces the resistance of the connection portions and protects the connection portions.

The present embodiment includes an insulation film formation step of forming the insulation film 40 in such a manner as to cover the pixel electrodes 33 (transparent electrodes) and the line 50 after the transparent electrode formation step and a common electrode formation step of forming the common electrode 39 on the insulation film 40 after the insulation film formation step. If the TFTs 32, the flattening film 47, the common electrode 39, the insulation film 40, and the pixel electrodes 33 are stacked in this order, it is necessary to form a contact hole in both the flattening film 47 and the insulation film 40 to connect the pixel electrodes 33 and the TFTs 32. In the present embodiment, the TFTs 32, the flattening film 47, the pixel electrodes 33, the insulation film 40, and the common electrode 39 are stacked in this order. Accordingly, the pixel electrodes 33 and the TFTs 32 can be connected by forming the contact hole 45 in only the flattening film 47.

In the present embodiment, after the formation of the transparent conductive film 51 as a base of the pixel electrodes 33 and the metallic film 52 as a base of the line 50, the metallic film 52 is etched to form the line 50 and the transparent conductive film 51 is etched to form the pixel electrodes 33. According to such a method, the adhesion of the pixel electrodes 33 and the line 50 is further increased as compared to the adhesion obtained by the procedure in which the line 50 is formed after the formation of the pixel electrodes 33.

Second Embodiment

Figure 10:
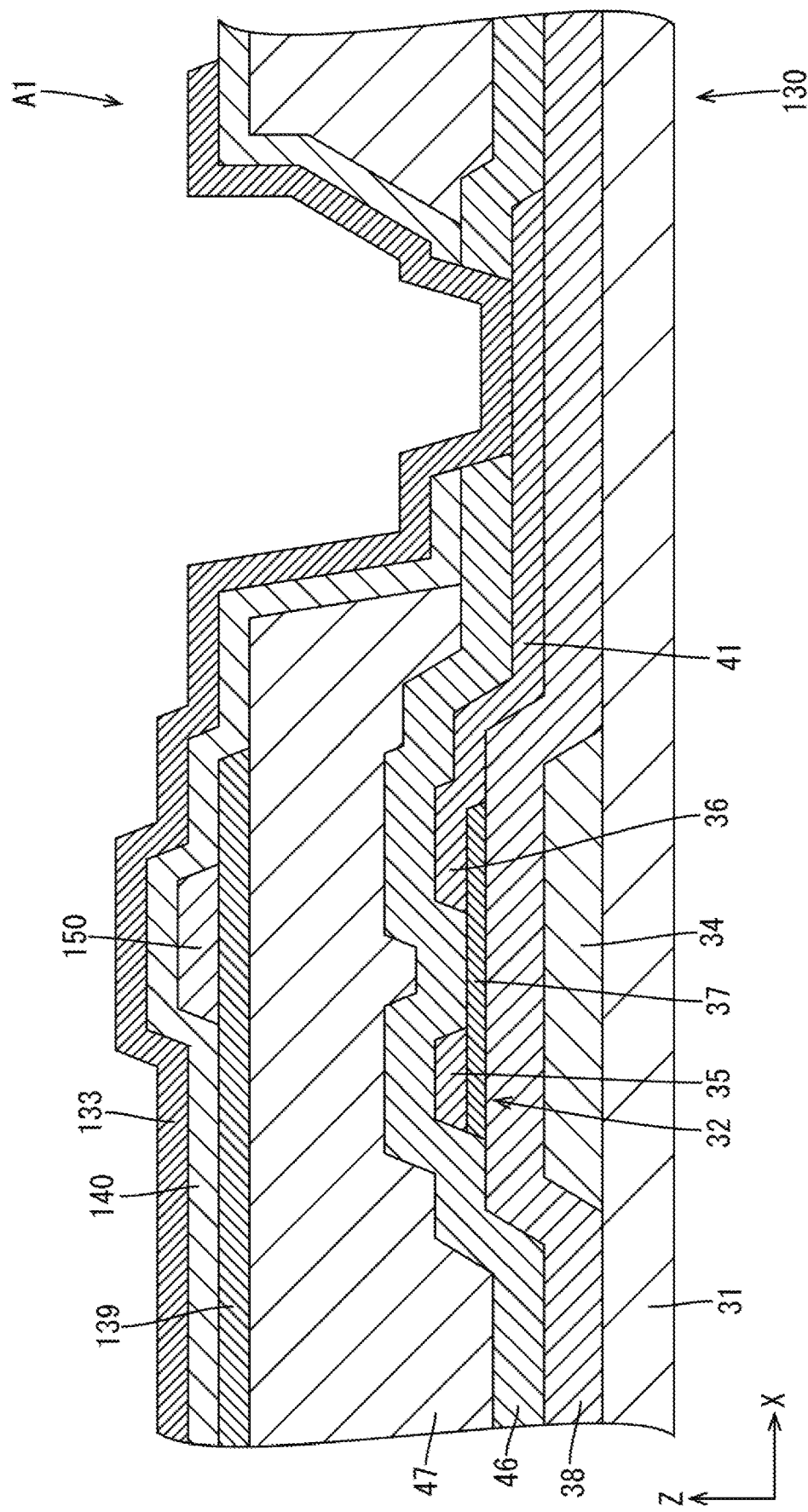
FIG. 10 is a cross-sectional view of an array substrate according to a second embodiment.

Next, a second embodiment of the technology described herein will be described with reference to FIG. 10. The same elements as those of the foregoing embodiment will be provided with the same reference signs as those of the foregoing embodiment and will not be described. In the foregoing embodiment, the pixel electrodes are taken as transparent electrodes connected to the line. In contrast, in an array substrate 130 of the present embodiment, a common electrode is taken as a transparent electrode connected to a line. In the array substrate 130, as illustrated in FIG. 10, a common electrode 139, a line 150, an insulation film 140, and pixel electrodes 133 are stacked in this order on the flattening film 47. The common electrode 139 (transparent electrode) is divided into sections according to position detection electrodes arrayed in a matrix in the display area A1. The lines 150 are connected to the position detection electrodes, respectively. The control circuit board 12 supplies drive signals for detecting the input position to the position detection electrodes via the driver 17 and the lines 150 and receives detection signals via the lines 150. Thus, the common electrode 139 acts as the position detection electrodes.

Other Embodiments

The technology described herein is not limited to the embodiments described above and with reference to the drawings. The following embodiments may be included in the technical scope.

(1) In the foregoing embodiments, the display panel is a liquid crystal panel, but the present technology is also applicable to other kinds of display panels.

(2) In the foregoing embodiments, the TFTs are used as switching elements, but switching elements other than the TFTs (for example, thin-film diodes (TFDs)) may be used.

The invention claimed is:

1. A method of manufacturing a display panel substrate, comprising:
    a transparent conductive film formation step of forming a transparent conductive film on a flattening film that covers a switching component disposed on a substrate;
    a metallic film formation step of forming a metallic film so as to cover the transparent conductive film after the transparent conductive film formation step;
    a line formation step of forming a line by etching the metallic film after the metallic film formation step; and
    a transparent electrode formation step of forming a transparent electrode that is connected to the line by etching the transparent conductive film after the line formation step.

2. The method of manufacturing a display panel substrate according to claim 1, wherein the transparent electrode is a pixel electrode that is connected to a drain electrode included in the switching component through a contact hole formed in the flattening film.

3. The method of manufacturing a display panel substrate according to claim 2, wherein in the line formation step, the metallic film is etched in a state that a portion of the metallic film covering the contact hole is covered with a resist.

4. The method of manufacturing a display panel substrate according to claim 2, further comprising:
    an insulation film formation step of forming an insulation film so as to cover the transparent electrode and the line after the transparent electrode formation step; and a common electrode formation step of, forming a common electrode on the insulation film after the insulation film formation step.

\* \* \* \* \*